United States Patent [19]

Spencer et al.

[11] Patent Number: 5,411,896
[45] Date of Patent: May 2, 1995

[54] METHOD OF MAKING SUPRA-PASSIVANT GRID

[75] Inventors: Donald D. Spencer, Waukesha, Wis.; Stephen P. Barlow, Noblesville; Mark F. Henderson, Kokomo, both of Ind.

[73] Assignee: Delco Electronics Corporation, Kokomo, Ind.

[21] Appl. No.: 43,695

[22] Filed: Apr. 8, 1993

Related U.S. Application Data

[62] Division of Ser. No. 851,607, Mar. 16, 1992, abandoned.

[51] Int. Cl.⁶ ............................................. H01L 21/56
[52] U.S. Cl. ................................... 437/7; 437/224
[58] Field of Search .................. 437/7, 170, 219, 220, 437/221, 224, 245; 257/659, 660

[56] References Cited

U.S. PATENT DOCUMENTS 4,947,235  8/1990  Roth et al. .......................... 257/659

FOREIGN PATENT DOCUMENTS 58-122776  7/1983  Japan .................................. 257/659
2-209735   8/1990  Japan .................................. 257/659

OTHER PUBLICATIONS

USSN 07/851,607 filed Mar. 16, 1992, entitled "Supra-Passivant Grid and Methods of Making and Using the Same", Donald D. Spencer et al, parent file of this application.

Primary Examiner—Brian E. Hearn
Assistant Examiner—Chandra Chaudhari
Attorney, Agent, or Firm—Cary W. Brooks; Jimmy L. Funke

[57] ABSTRACT

A supra-passivant grid is disclosed which is capable of conducting residual charge from the surface of an integrated circuit and eliminating generic leakage effects on sensitive circuitry below.

11 Claims, 6 Drawing Sheets

METHOD OF MAKING SUPRA-PASSIVANT GRID

This is a division of application Ser. No. 07/851607, filed on 16 Mar. 1992, now abandoned.

FIELD OF THE INVENTION

This invention relates to a supra-passivant grid which protects underlying lightly doped epitaxial regions of an integrated circuit from inverting due to charges trapped on top of the passivation layer or along the package molding compound to the passivation interface, and methods of making and using the same.

BACKGROUND

The principals and effects of "generic leakage" have been demonstrated throughout the integrated circuit industry. A primary instigator of generic leakage has been found to be due to residual charges which become trapped along the uppermost surface of an integrated circuit or the passivation layer. Integrated circuit passivants, such as plasma nitride, are generally non-conductive materials which are highly resistant to penetration from external contaminants. The passivation layer protects the circuits of the integrated circuit from chemical effects of these external materials which can dramatically reduce the operating life and performance of the integrated circuit devices. The passivation is generally non-conductive to prevent unintentional leakage paths from forming between circuit elements on the integrated circuit, in particular, between metal pads and interconnecting runners.

Figure 1:
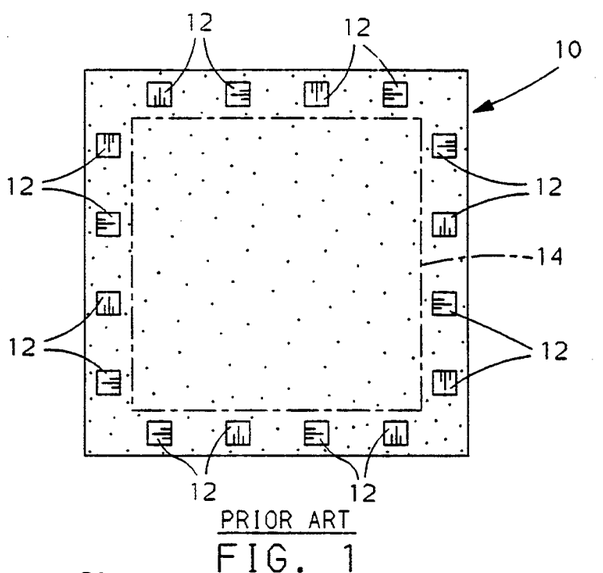
FIG. 1 is an illustration of a typical integrated circuit element in plan view, passivated with a plasma nitride film and having a region of charge-sensitive circuitry.
Figure 2:
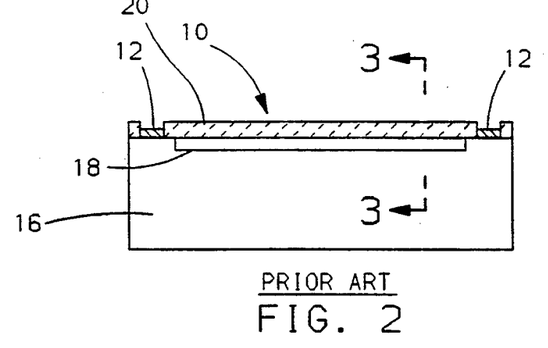
FIG. 2 is a cross-sectional view of a typical integrated circuit element showing pad details and plasma nitride passivation.
Figure 3:
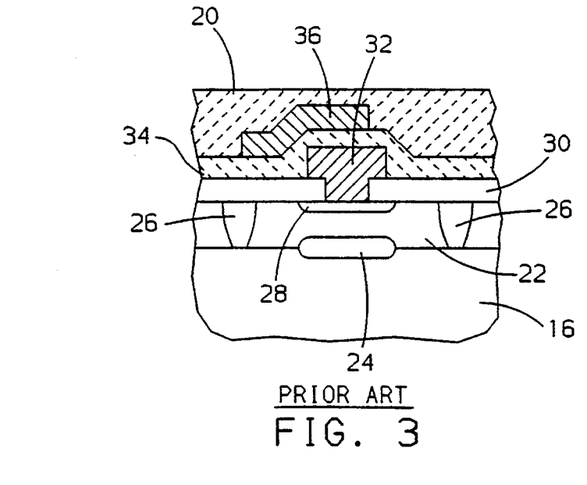
FIG. 3 is a cross-section enlargement of a selective portion of FIG. 2 showing details of a typical integrated circuit element.
Figure 4:
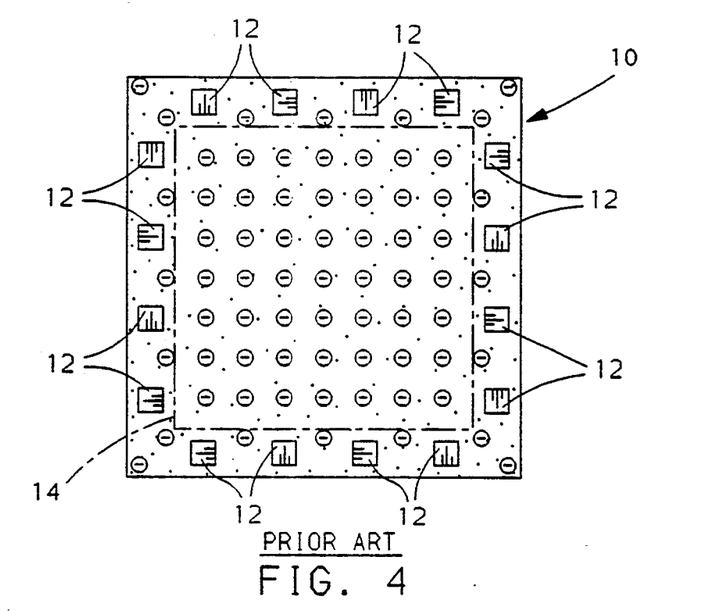
FIG. 4 is an illustration of a passivation surface covered with distributed static charge and a region of charge-sensitive circuitry.
Figure 5:
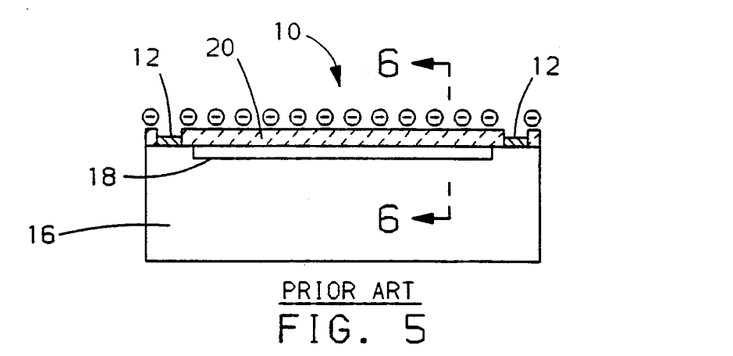
FIG. 5 is a cross-section of an integrated circuit, showing a distribution of accumulated charge across the surface of plasma nitride passivation.
Figure 6:
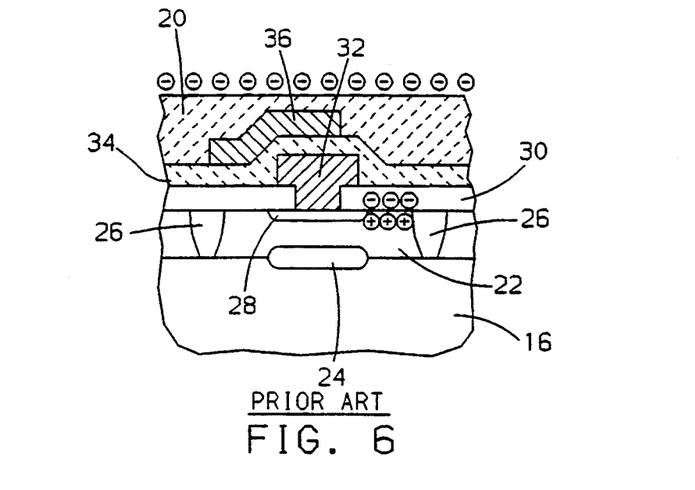
FIG. 6 is a cross-section of a selective portion of FIG. 5 showing detail of surface inversion caused by charge accumulation on the passivation layer.

On the surface of a typical integrated circuit, P-type resistors and devices may be formed within lightly N-doped epitaxial pockets which are electrically separated from surrounding using standard reverse biased diode techniques as illustrated in FIGS. 1, 2 and 3. However, the potential created by either accumulated charges in the molding compound (used in packaging the integrated circuit) or on top of an integrated circuit passivation layer can be enough to invert the surface of the epitaxy thereby creating a leakage path across the pocket to whatever the insulation well is tied to. This classic example of generic leakage phenomenon is illustrated in FIGS. 4–6. The generic leakage phenomenon can be present in hybrid/cavity (vacuum) encapsulated integrated circuits and applications.

Once an integrated circuit has been encapsulated within a package, usually in the form of an epoxy-based compound, it is protected from the environmental elements outside the boundaries of the package. Although epoxy molding compounds are somewhat penetrable by humidity and temperature over time, the plasma nitride passivation protects integrated circuit elements from any material defused with the moisture. These contaminants are generally ionic in nature, such as chlorine. In addition, the molding compound itself generally contains ionic materials such as bromine, etc., which are used as a package fire retardant.

Figure 7:
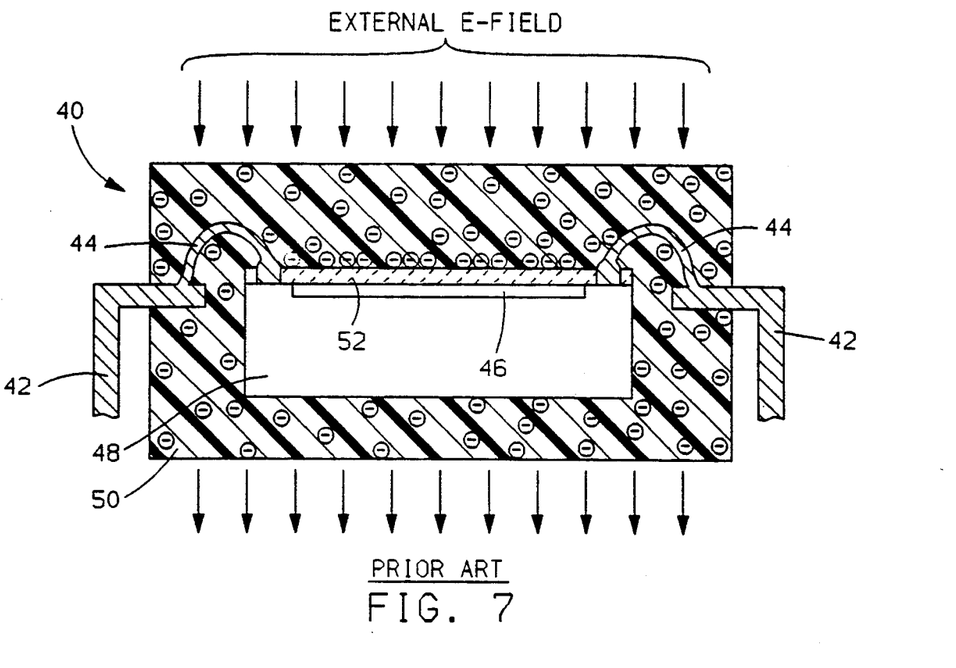
FIG. 7 is an illustration of a packaged integrated circuit showing mobile ions attracted to the surface of the integrated circuit's passivating layer.

At room temperature or under normal electrical conditions, these ionic contaminants remain stable and evenly dispersed within the epoxy or packaging material. Net charge distribution can be initially considered relatively neutral. However, when the molding compound is at elevated temperatures, it is very prone to external charge transfer and internal polarization, due to surface triboelectric charging (i.e., hot air movement from a handler) or nearby electric fields from charged surfaces or by the molding process. Often the device experiences increased temperatures above 150° C. for example; due to high temperature ambient operations, or heat generated when operating the device, or effects of infrared (IR) solder reflow during system assembly, or by other methods of heating the device. As the device experiences elevated temperatures, the ions contained within the package tend to become freely mobile. These ions can be attracted to the surface of the integrated circuit by fields generated from electric current passing through the integrated circuit or by external fields, such as those generated in burn-in chambers or test handlers. As mentioned before, such a source of external field may be produced by circulating very hot, dry air which promotes significant levels of charge transfer and creates unwanted E-fields in the ambient environment. Eventually, ionic charges accumulate on the interface of the molding compound and the integrated circuit passivation. When like charges combine with increasing overall magnitude, a potential is distributed across the surface of the integrated circuit. As the package cools down, either from removal of power and/or reduction in temperature, the charges tend to "lock" into place. Both the molding compound and the passivation surface are non-conductive, and therefore the trapped charges have no place to leak off. FIG. 7 shows an integrated circuit with a package which has sustained a cool-down/lock-in phenomenon and has accumulated a negative charge on the top of its passivating layer.

Another situation which can produce unwanted charge on a passivation surface is "delamination." This can occur when the package material separates itself from the surface of the integrated circuit. This separation usually occurs through cycles of heating and cooling and leaves residual charges due to triboelectric differences in the materials. It has been discovered that a negative charge is left on the passivation layer such as plasma nitride, while positive charge resides on the packaging materials such as epoxy. This phenomenon is more prevalent with large integrated circuits, which inherently have higher amounts of encapsulated related stress due to longer body diagonal dimensions causing delamination at the corners of the die body that is encapsulated.

Thus, a means is needed to protect an underlying lightly doped epitaxial region of an integrated circuit chip from inverting due to charges either trapped in the packaging material or on the passivation layer. Further, there is a need for a means for "curing" a defective device which has been discovered to have charges trapped either in the molding compound or on the passivation layer.

Adequate field-plating of every inversion or generic leakage susceptible circuit element is not usually practical in most integrated circuit designs. Dual-level metal helps in this situation, by allowing another metallic layer with which to field plate while circuit signals are carried around a sensitive device. However, many designs simply cannot tolerate the area increase needed to manage adequate protection to all sensitive elements of the integrated circuit. In BiCMOS applications, polysilicon might be used to provide field-plate protection. However, none of these approaches attack the root cause of the problem, which is accumulated charge and increasing static potential on the surfaces of the molding compound and on the top surface of the integrated circuit passivation. Indeed, this affects not only generic leakage sensitive circuits, but creates variations in MOS device parameters, such as thresholds, the sheet resistance of lightly-doped poly or implanted resistors, and many other device parameters which influence an integrated circuit's performance criteria.

SUMMARY OF THE INVENTION

The nature of the invention is to provide a means to drain unwanted charges from the surface of an integrated circuit finishing member such as a passivation layer or a molded package and to prevent the build-up of accumulated charges which can induce generic leakage problems. According to the present invention, an electrically conductive grid is placed on top of the final passivating layer of an integrated circuit. Preferably, this grid falls between the device housing such as the molding compound of the package or the package of the hybrid subassembly, and the uppermost surface of the passivation layer of the integrated circuit. The grid may be electrically conductive to a ground pin of the integrated circuit but does not serve as a conducting element for any circuit of the integrated circuit. Alternatively, the grid may have an applied DC voltage. The grid provides a leakage path for any mobile charges which exist in the packaged integrated circuit. The grid can also be used to "cure" any defective device which is found to have accumulated charge in the molding package or on the passivation layer. The invention also includes a method of preventing generic leakage including forming or placing an electrically conductive line on a passivation layer over an arc of a semiconductor device susceptible to inversion due to accumulated charge on the passivation layer or within a molded package. The invention includes the grid and methods of making and using the same.

DETAILED DESCRIPTION

The problem of "generic leakage" and the solution provided by the present invention are better understood by the background illustrations of FIGS. 1–8. FIG. 1 illustrates a typical integrated circuit 10 as seen from above including electrical interconnection pads 12 and a region of charge-sensitive circuitry 14. FIG. 2 is an illustration of a cross-section of a typical integrated circuit such as that in FIG. 1 showing interconnection pads 12, P-type substrate 16, charge or generic leakage sensitive circuits 18, and a plasma nitride passivation 20. FIG. 3 is an illustration of a cross-sectional portion taken along line 3—3 of FIG. 3 in enlarged form including a P-type substrate 16 and an overlying N-type epi 22 having a buried layer 24 formed at the interface of the N-type epi and the P-type substrate. P- isolation regions 26 are spaced apart formed in the N-type epi and a resistor 28 is formed in the N-type epi near its upper surface. Field oxide 30 overlies the N-type epi and surrounds and overlies at least a portion of the resistor. A first metal 32 is formed communicating with the resistor. Overlying the first metal is an inner dielectric layer 34. The inner dielectric layer 34 may be for example a metal nitride, or a sandwiched insulator such as a polyimide/plasma oxide combination. Formed on top of the inner metal nitride layer and overlying the first metal is a second metal 36. Overlying the integrated circuit is a nitride passivation layer 20 having vias (not shown) formed therein at appropriate locations for example at pad locations.

FIG. 4 is an illustration of a passivated integrated circuit 10 similar to that of FIG. 1 but covered with residual charge. FIG. 5 is a cross-section illustration of an integrated circuit similar to that in FIG. 4 showing a distribution of accumulated charge across the surface of the plasma nitride passivation. Likewise, FIG. 6 is a cross-sectional illustration of an integrated circuit taken along lines 6—6 of FIG. 5 and illustrating charge accumulation on the passivation layer. Also illustrated in FIG. 6 is a region of positive charge developed along the upper layer of the N-type epi between the resistor and a P- isolation region. Due to the presence of built-up charge (in this case negative charge) on the passivation layer, positive charges are attracted to the upper surface of the N-type epi material thus creating a parasitic transistor action or inversion path to occur between the resistor and the P-isolation region resulting in a leakage path and failure of the device.

FIG. 7 illustrates a packaged integrated circuit 40 under bias and at temperature. The package includes package leads 42, bond wires 44 connecting the leads to an integrated circuit 46 formed in a P-type substrate 48 and surrounded by a package body 50 primarily of epoxy-base material with some ionic content. Mobile ions are attracted to the surface of the chip's passivating layer 52, where they may accumulate. The presence of an external E-field or even an internal E-field in the molding compound created from non-random charges and enhanced by biases within the integrated circuit, can accelerate the process of charge accumulation.

Figure 8:
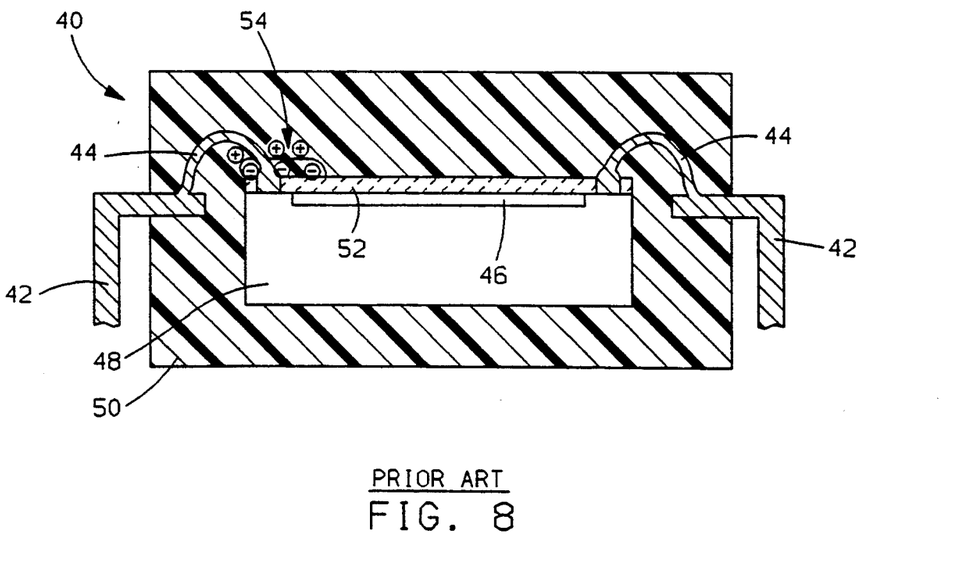
FIG. 8 is an illustration of a packaged integrated circuit having a region of delamination.

Delamination is another source of charge accumulation and is illustrated in FIG. 8. FIG. 8 includes a packaged integrated circuit having package leads 42, bond wires 44 connecting the leads to an integrated circuit 46, a P-type substrate 48 and a package body 50 primarily of epoxy-base material with some ionic content. Thermal cycling of large dies under bias conditions can sometimes delaminate the molding compound away from the surface of the passivated die (at 54). The resulting affect of separating two triboelectric compounds in this manner is a net charge residual on both the surface of the die and the isolated edge of the epoxy. It has been found that the polarity of the charge left on the surface of the plasma nitride is the same as if ionic charge had been accumulated, and is the proper polarity to create inversion of typical surface elements should sufficient potential be required.

Figure 9:
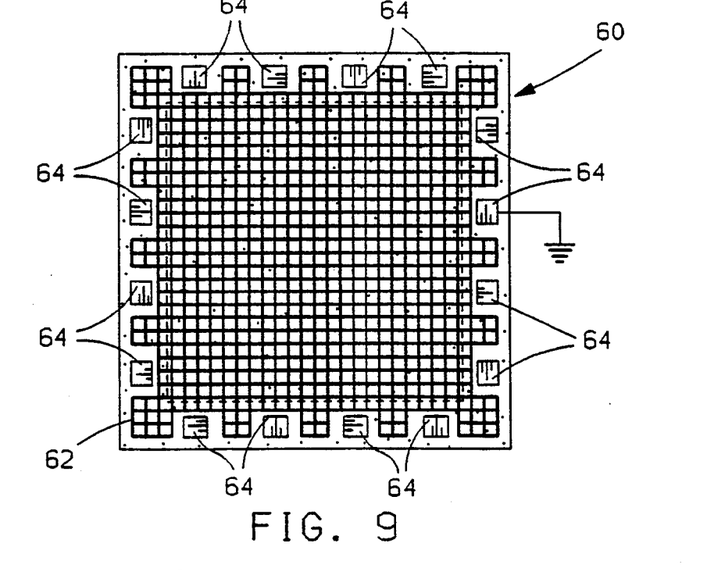
FIG. 9 is an illustration of an integrated circuit element having a supra-passivating grid covering a plasma nitride film.
Figure 10:
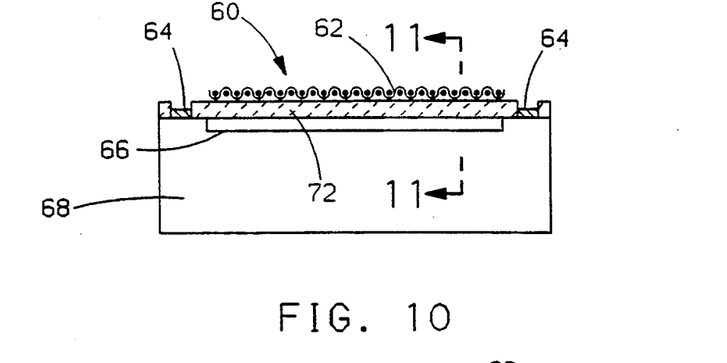
FIG. 10 is an illustration of a cross-section of an integrated circuit element having a supra-passivating grid.
Figure 11:
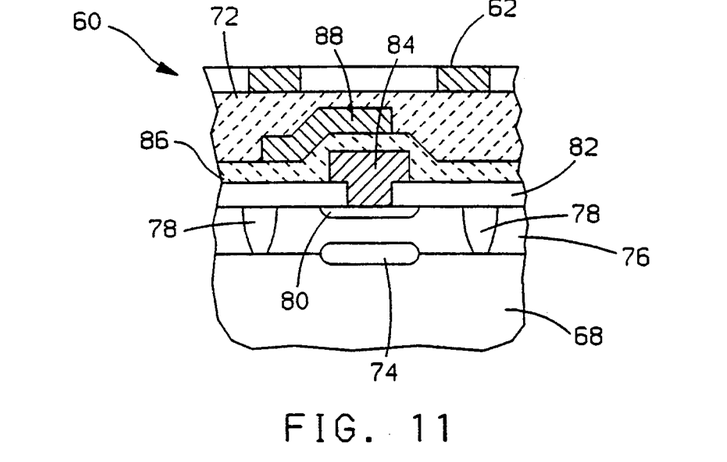
FIG. 11 is an enlarged view of a selective portion of FIG. 10 showing a supra-passivant grid providing electrical leakage path for spurious ionic charges.

The present invention includes a passivated integrated circuit with a supra-passivant grid installed and tied to ground or an applied DC voltage. FIG. 9 illustrates such device 60 including an integrated circuit with a supra-passivant grid 62 as seen from above including electrical interconnection pads 64 and grid 62 overlying a region of charge or generically leakage sensitive circuits. FIG. 10 is a cross-section illustration of an integrated circuit with a supra-passivant grid in place similar to that of FIG. 10 showing an integrated circuit 66 on a P-type substrate 68, interconnecting pads 64, a plasma nitride passivation 72 and an overlying grid 62. FIG. 11 is an illustration of a cross-section of a device according to the present invention taken along lines 11—11 of FIG. 10. The device 60 includes a P-type substrate 68 having a buried layer 74 formed between the P-type substrate and an N-type epitaxial layer 76. P-isolation regions 78 are spaced apart and formed in the N-type epitaxy. A resistor 80 is formed at the upper region of the N-type epitaxy between the P- isolation regions. Field oxide 82 overlies the N-type epi and at least a portion of the resistor. A first metal 84 formed over the resistor and communicates therewith. An inner metal nitride layer 86 overlays the first metal and the field oxide. A second metal 88 overlays at least a portion of the first metal and a nitride passivation layer overlies the integrated circuit. Formed on top of the nitride passivation 72 is a metal grid which provides an electrical leakage path to ground or has an applied DC voltage. The metal grid 62 prevents any build-up of charges in the passivation layer by allowing the charges as they become mobile to follow the path of the metal grid. Likewise, when the grid is placed over a device found to have build-up charges, the grid will provide a means for curing a device having such build-up charges.

Figure 12:
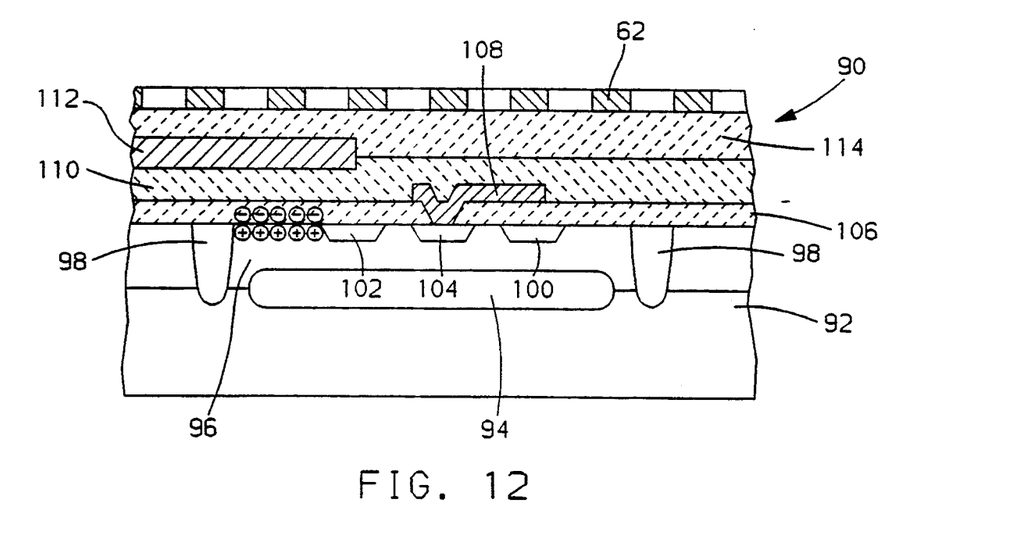
FIG. 12 is an illustration of second metal inversion of an integrated circuit element.

The use of the metal grid to solve the above-stated problems is contemplated for both single layer and multiple layer metal devices. However, some unique problems are associated with multiple level metal devices. FIG. 12 is an illustration of an unique problem known as "second metal inversion" for a dual metal device. As illustrated in FIG. 12, such devices 90 typically include a P-type substrate 92 including a buried region 94 formed at the interface of an N-type epi 96 overlying the P-type substrate. P- isolation regions 98 are spaced apart and formed in the N-type epi and communicate with the P-type substrate. Between the P-isolation regions there is formed a collector 102, an emitter 104, and an N+ diffusion (or base) 100 to provide a low resistive path through the N- epi. An insulating layer 106 typically of silicon dioxide (or field oxide) is formed over the N- epi. A first metal 108 is formed over the insulating layer 106 and communicates with the emitter 104. A silicon nitride layer 110 is formed over the first metal, and oxide layers, and separates the same from a low potential second metal 112 formed on top of the silicon nitride layer. A second silicon nitride layer 114 covers the device. The first layer of silicon nitride, or intermetal dielectric layer, can have trapped charges accumulated therein. When a voltage is applied to the N-type epi, typically 15 volts, a strong potential is developed between the N-type epi and the low potential second metal which is usually tied to ground. As a result, an electric field is generated between the metal layer 112 and the N-epi 96 such that positive charges accumulate at the surface of the N-type epi creating an inversion path in the epi between similar diffusion regions such as the P- isolation and the collector to create a parasitic field effect transistor action leading to a leakage path and failure of the device. This also reduces device yield.

Figure 13:
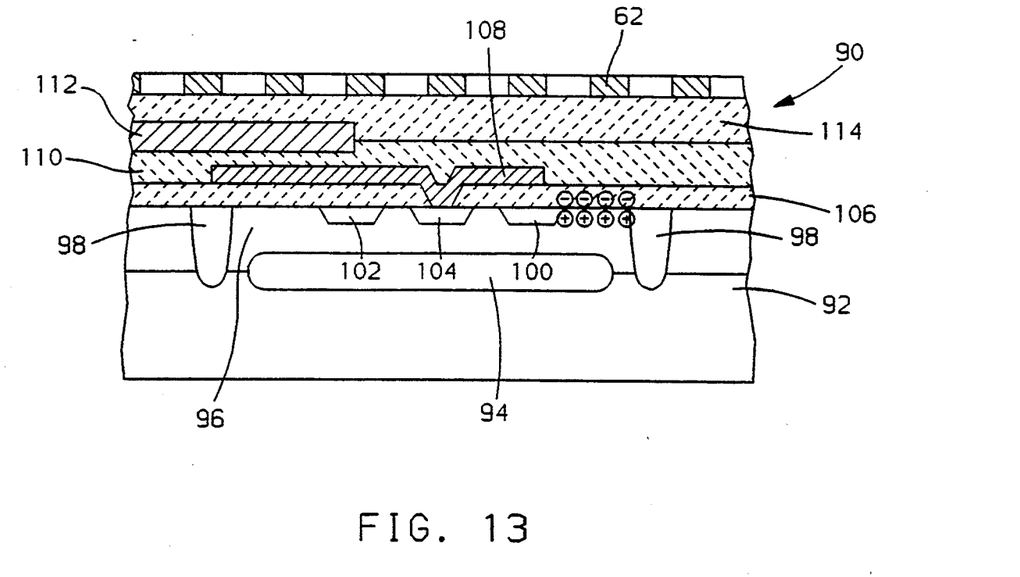
FIG. 13 is an illustration of third metal inversion caused by no or low potential supra-passivant grid.

As shown in FIG. 13, this problem can be corrected or fixed by extending the first metal 108 to overlie the P-isolation 98 and collector region thus blocking any potential from developing between the N- epi and the second metal in the area between the P- isolation and the collector. However, when a metal grid is placed on top of the passivation layer to drain off any accumulated-charges in the passivation layer due to the molding process or any of the above mechanisms, there is a potential for a "third metal inversion". At any location in the device where the grid 62 overlies the N-type epi between two similar diffused regions in the epi, a potential for a third metal inversion exists. For example, the region in FIG. 13 along the upper layer of the N-type epi between the P-region 100 and the P-type isolation 98, there is a portion of the grid directly overlying this region of the N-type epi. If the grid was tied to ground, a portion of the grid would overlie at least a portion of the region in the upper surface of the N-type epi between the P-region 100 and P- isolation region. As a result, a potential between the N-type epi of at least 15 volts and the grid tied to ground is developed such that positive charges will accumulate along the upper surface of the N-type epi between the P-region 100 and the P- isolation. This will result in a parasitic field effect transistor action which creates an inversion path between the P-region 100 and the P- isolation region and failure of the device. Thus, also reducing device yield. Such inversion normally occurs when there is a potential difference between the N-type epi and a conductive surface of about 12–15 volts. To solve this problem, a potential may be applied to the grid. In designing the supra-passivant grid structure, the voltage potential is important to insure against the creation of parasitic MOS transistor action or leakage currents due to surface inversion paths under the unwanted parasitic gate formed by the supra-passivant grid. The supra-passivant grid metal may act as a parasitic gate, in which case the material underlining the supra-passivant grid metal acts as a parasitic gate oxide, and finally the adjacent diffusions which are bridged by the supra-passivant grid metal material act as a parasitic source and drain diffusions. Thus, in determining the supra-passivant grid potential, the potential difference between the supra-passivant grid to the underlining silicon should not be such that E-fields developed are strong enough to create parasitic transistor action or inversion paths to occur, resulting in stray leakage paths on the integrated circuit. In most instances, applying 5 volts to the grid to a device having N-type epi at 15 volts will avoid leakage paths being developed by third metal inversion. In such a case, the potential difference between the N-type epi and the grid is only 10 volts. This is not sufficient to turn on a channel between two similar diffusion regions in such a device.

Figures 14A, 14B:
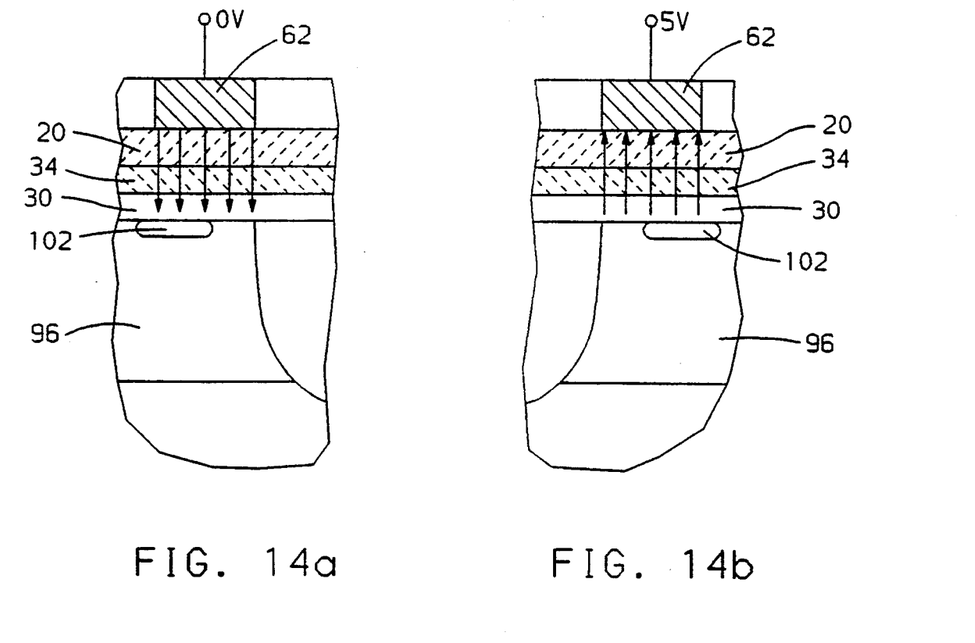
FIG. 14a and 14b respectfully illustrated cross-sections of a semiconductor device having a supra-passivant grid for low voltage applications with the grid tied to Vss and to Vcc.

In FIGS. 14a&b, a typical cross-section of an IC for low voltage applications (i.e., Vcc=5 V) shows that a supra-passivant grid 62, or SPG, can be used if tied to either Vcc (FIG. 14b) or Vss (FIG. 14a). For example, the N- epi 96 may be biased at 5 V. In this case, the threshold voltage of the parasitic P-channel enhancement mode MOSFET is not exceeded, due to the low potentials utilized, and hence low E-fields generated.

Figures 15A, 15B:
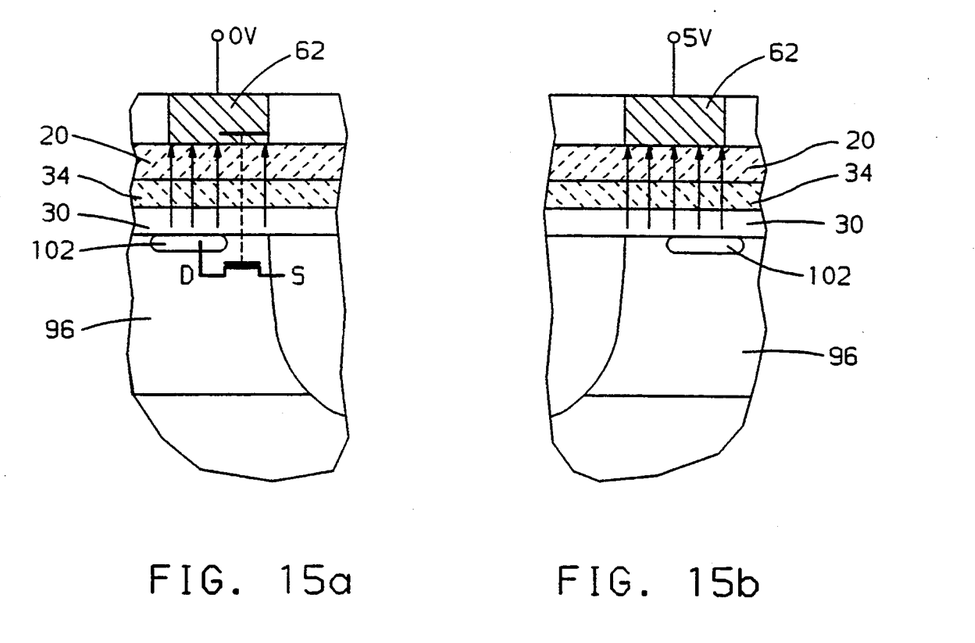
FIGS. 15a and 15b respectfully illustrate a cross-sections of a semiconductor device having a supra-passivant grid for high voltage applications with the grid tied to Vss and to VCC.

In FIGS. 15a&b, a high voltage (VCC=16 V) is introduced per some automotive and aerospace applications' requirements. For example, the N- epi 96 may be biased at 15 V If the supra-passivant grid were tied to Vss(OV) (FIG. 15a), then a significant E-field could be generated, and could exceed the approximate threshold (8E06–1E07 V/meter) for the parasitic MOSFET to turn on. Hence, a surface inversion region would be created, and result in failure of the device to function as intended.

In FIG. 15b, if the SPG grid is tied to some positive potential (i.e., from 5 V to VCC), then the threshold of the parasitic MOSFET is not exceeded. Such a positive, static potential on the grid creates no circulation currents and has been shown to create no adverse effects towards the reliability of the IC.

In accordance with the present invention, the grid may be formed over the passivation layer by any number of means including printing a conductive paste, chemical vapor deposition of a conductive material or sputtering a conductive material over the passivation layer followed by etching. A preferred method is sputtering. A device such as that illustrated in FIG. 1 having a substrate, and an integrated circuit covered by a passivation layer having vias formed therein for communication with electrical connection pads may be used. The electrical connection pads may be protected from the sputtering and etching steps necessary to produce the grid by filling the vias or masking the pads in a manner known in the art. Once the pads have been protected, any electrically conductive material may be sputtered onto the passivation layer. The material is then masked to delineate the grid formation followed by etching away selective portions of the material not masked. The grid formed on the device does not have to be further protected. However, an additional passivation layer to protect the grid from scratches is optional. The grid may be formed of any conductive material and for example may be a single layer or successive layers. Preferably, the grid is prepared from a composition comprising at least one selected from the group consisting of aluminum, nickel, copper, or gold. A preferred composition comprises 98% aluminum, 1% Si and 1% Cu sputtered onto the passivation layer.

The grid may take on a variety of shapes but preferably consists of longitudinal conductive lines and transverse conductive lines which are substantially perpendicular to each other. The transverse and longitudinal lines may be of a variety of thicknesses. Preferably the thickness of each ranges from about 100 to about 12,000 Angstroms. It has been discovered that the grid may be made so thin as to be transparent, thus allowing for easy visual inspection of the electronic device underneath. The transverse and longitudinal conductive lines may vary in width and preferably range from about 2 Angstroms to about 120 microns, more preferably from about 1 micron to about 25 microns and most preferably about 15 microns.

Not all grid formations will work to prevent generic leakage. It has been discovered that the spacing between adjacent longitudinal conductive lines or adjacent transverse conductive lines has a bearing on whether or not such a grid will work to prevent generic leakage. It has been discovered that when the spacing between adjacent longitudinal conductive lines or transverse conductive lines is greater than 225 microns, such a device will not work to prevent generic leakage. It has been discovered that when the spacing between adjacent longitudinal conductive lines or adjacent transverse conductive lines ranges from about 15 microns to about 45 microns, a grid having such a construction prevents generic leakage without exception. It has been discovered that when the spacing between adjacent longitudinal conductive lines or adjacent transverse conductive lines is about 105 microns, such a structure is effective in preventing generic leakage most of the time but with a few failures. Naturally, there are spacing dimensions between adjacent longitudinal or transverse conductive lines that are greater than 15 microns but less than 105 microns that work to prevent generic leakage and are considered equivalents to any claim spacing range defined hereafter.

The following example is illustrative the surprising findings regarding the structure and more specifically the geometric arrangement of the grid.

EXAMPLE I

Integrated circuit devices may be prepared and protected with a passivation layer of silicon nitride. A conductive material comprising 98% aluminum, 1% Si, and 1% Cu may be sputtered onto the passivation layer in a manner known in the art. A mask, translated by photolithographic art, may be patterned onto the sputtered layer corresponding to a predetermined grid formation. Selective portions of the sputtered material may be removed by etching it with wet or dry etching techniques in a manner known in the art. The mask may be removed from the sputtered material by stripping techniques in a manner known in the art.

EXAMPLE II

Five different grid formations were prepared over the passivation layer of an integrated circuit in a manner as described above. Multiple samples of each of the five different grid formations were evaluated. In each case, the width of each transverse and longitudinal conductive line was about 15 microns and the thickness about 10,000 Angstroms or 1 micron. The metal conductive material comprised 98% aluminum, 1% Si and 1% Cu. In each case, adjacent longitudinal conductive lines and adjacent transverse conductive lines formed a square. In a first geometric formation of the grid, the spacing between both adjacent transverse conductive lines and adjacent longitudinal conductive lines was 15 microns. In a second geometric formation of the grid, the spacing between both adjacent transverse and longitudinal conductive lines was 45 microns. In a third geometric formation of the grid, the spacing between both adjacent transverse and adjacent longitudinal conductive lines was 105 microns. In a fourth geometric formation of the grid, the spacing between both adjacent transverse and adjacent longitudinal conductive lines was 225 microns. In a fifth geometric formation of the grid, the spacing between both adjacent transverse and adjacent longitudinal conductive lines was 465 microns.

A micro manipulator probe was positioned about 5/1000 inches above each sample of the five different geometric shaped grids. The tip of a zero-stat gun was connected to ground and the trigger depressed to drain off positive charge produced by the gun. The tip of the gun was then connected to the micro manipulator probe and a trigger released so that negative charges ionize the air between the probe and the integrated circuit device so that the device was showered with negative charges. The process was also repeated for a control device having no grid. A suitable zero-stat gun is available from electronic or radio retail stores.

Using a curve tracer, the five different geometric grid formations and the control device having no grid, were compared to a standard part to determine the presence of generic leakage. The results of the test are presented in Table I.

TABLE I

| Spacing between adjacent longitudinal or transverse conductive lines | Results |
| --- | --- |
| 15 microns | All Passed |
| 45 microns | All Passed |
| 105 microns | Most passed but a few failures |
| 225 microns | All Failed |
| 465 microns | All Failed |
| No Grid | Failed |

When the invention or an element of the invention is defined in terms of ranges or proportions, such is intended to convey the invention as including the entire range, or any sub-range or multiple sub-ranges within the broader range. For example, when an element of the invention is described as containing about 5 to about 95 weight percent of component A, such is intended to convey the invention as also including from about 5 to about 40 weight percent A, from about 20 to about 30 weight percent A, and from about 90 to about 95 weight percent A.

The embodiments of the invention in which an exclusive property or privilege is claimed are defined as follows:

1. A method of curing an apparatus having a semiconductor device and a coating communicating with at least a portion of said semiconductor device and having trapped charges on said coating, comprising the steps of forming a conductive grid over said coating in a geometric form sufficient to provide a conductive path to bleed off said trapped charges and prevent generic leakage, and said grid being connected to ground and said grid comprising a plurality of spaced apart substantially parallel longitudinal conductive lines and a plurality of spaced apart substantially parallel transverse conductive lines, and wherein said adjacent longitudinal conductive lines are spaced apart from each other a distance ranging from about 15 to about 150 microns and said adjacent transverse conductive lines are spaced apart from each other a distance ranging from about 15 to about 150 microns.

2. A method as set forth in claim 1 wherein said coating comprises a passivation layer.

3. A method as set forth in claim 1 wherein said coating comprises a molded package.

4. A method of curing an apparatus having a semiconductor device and a coating communicating with at least a portion of said semiconductor device and having trapped charge on said coating, said semiconductor device having an epitaxial layer having at least two islands of similarly doped material formed therein, comprising the steps of forming a conductor grid over at least a portion of said semiconductor device in a geometric formation sufficient to provide a conductive path to bleed off said trapped charges and connecting said grid to a sufficient DC voltage to prevent any potential between said grid and said epitaxial layer from forming a conductive path in said epitaxial layer between said two similarly doped islands.

5. A method as set forth in claim 4 wherein said coating comprises a passivation layer.

6. A method as set forth in claim 4 wherein said coating comprises a molded package.

7. A method of preventing generic leakage in an apparatus having a semiconductor device including a sea of doped epi and first and second islands of oppositely doped epi, and a passivation layer overlying at least a portion of said semiconductor device, comprising the steps of forming a conductive line of material on said passivation layer overlying and extending between said first and second islands and connecting said conductive line of material to ground and applying a DC voltage to said sea of doped epi, wherein the magnitude to the DC voltage is less than a value required to establish an electric field of about $8 \times 10^6$ volts/meter in said semiconductor device, thereby preventing inversion of a portion of said sea of doped epi between said first and second islands of oppositely doped epi.

8. A method of preventing generic leakage in an apparatus having a semiconductor device including a sea of doped epi and first and second islands of oppositely doped epi, and a passivation layer overlying said semiconductor device, comprising the steps of forming a conductive line of material on said passivation layer overlying and extending between said first and second islands, and connecting said conductive line of material to a first voltage, and applying a second voltage to said sea of doped epi, wherein said first and second voltages are such that a potential developed between the conductive line of material and the semiconductor device having the sea of doped epi does not cause a leakage path between the first and second islands of said semiconductor device.

9. A method as set forth in claim 8 wherein said first voltage applied to said sea of doped epi is at least 15 volts.

10. A method as set forth in claim 8 wherein said potential developed between the conductive line of material and the sea of epi does not exceed 10 volts.

11. A method of using an electrically conductive grid to prevent generic leakage in a semiconductor device having a passivation layer secured thereto, comprising the steps of superimposing said grid on said passivation layer and securing said grid to a voltage such that said grid provides a conductive path to bleed off charges accumulated in the passivation layer, and said grid comprising a plurality of spaced apart transparent conductive lines permitting visual inspection of said semiconductor device under said grid.

* * * * *